United States Patent
Sudo et al.

(10) Patent No.: US 9,570,114 B1
(45) Date of Patent: Feb. 14, 2017

(54) LAMINATED FILM-PACKED HARD DISK DRIVE FOR HERMETIC SEALING

(71) Applicant: HGST Netherlands B.V., Amsterdam (NL)

(72) Inventors: Kimihiko Sudo, Yokohama (JP); Kazuki Takeichi, Yamato (JP); Takako Hayakawa, Hiratsuka (JP); Yuta Onobu, Yokohama (JP)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/997,464

(22) Filed: Jan. 15, 2016

(51) Int. Cl.
G11B 33/14 (2006.01)

(52) U.S. Cl.
CPC ......... *G11B 33/1486* (2013.01); *G11B 33/148* (2013.01)

(58) Field of Classification Search
CPC .... G11B 33/14; G11B 33/1486; G11B 33/148
See application file for complete search history.

(56) References Cited

U.S. PATENT DOCUMENTS

| | | | |
|---|---|---|---|
| 5,279,873 A | 1/1994 | Oike | |
| 5,454,157 A * | 10/1995 | Ananth | G11B 33/121 29/467 |
| 6,970,322 B2 * | 11/2005 | Bernett | G11B 33/122 360/245.9 |
| 7,218,473 B2 * | 5/2007 | Bernett | G11B 33/1466 29/603.03 |
| 7,291,784 B2 | 11/2007 | Moore et al. | |
| 7,522,375 B2 | 4/2009 | Tsuda et al. | |
| 7,538,972 B2 | 5/2009 | Burts-Cooper et al. | |
| 7,692,891 B2 | 4/2010 | Hatchett et al. | |
| 7,929,247 B2 * | 4/2011 | Uefune | G11B 33/1466 360/97.22 |
| 7,986,490 B2 * | 7/2011 | Hirono | G11B 25/043 360/97.22 |

(Continued)

FOREIGN PATENT DOCUMENTS

| | | |
|---|---|---|
| JP | 08045256 A | 2/1996 |
| JP | 08161881 A | 6/1996 |
| WO | WO2012094434 A1 | 7/2012 |

OTHER PUBLICATIONS

S. Fujio, Hard Disk Drive Enclosure Sealing for Electromagnetic Noise Immunity, IP.com, included in the prior art database Mar. 27, 2005 (Original Publication Date: Jun. 1, 1994), 2 pp., IP.com Disclosure No. IPCOM000112786D, IBM, downloaded from https://priorart.ip.com/IPCOM/000112786.

*Primary Examiner* — Brian Miller
(74) *Attorney, Agent, or Firm* — John D. Henkhaus

(57) ABSTRACT

A hermetically-sealed hard disk drive (HDD) utilizes a laminated film enclosure to hermetically seal an HDD within. The laminated film enclosure may be constructed of a heat sealant layer hermetically-sealed around the HDD, a barrier layer which inhibits gas from escaping from inside the laminated film enclosure, and a film surface protective layer which protects the heat sealant and barrier layers. Embodiments may include a heat sealant layer comprising a thermoplastic polymer such as polypropylene, a barrier layer comprising a metal such as aluminum, and a film surface protective layer comprising a thermoplastic polymer such as polyethylene terephthalate.

22 Claims, 6 Drawing Sheets

(56) References Cited

U.S. PATENT DOCUMENTS

| | | | |
|---|---|---|---|
| 8,014,167 B2 | 9/2011 | Gunderson et al. | |
| 8,194,348 B2 | 6/2012 | Jacoby et al. | |
| 8,248,724 B2 * | 8/2012 | Hayakawa | G11B 25/043 360/97.12 |
| 8,279,552 B2 * | 10/2012 | Stipe | G11B 25/043 360/99.18 |
| 8,335,050 B2 | 12/2012 | Kavosh et al. | |
| 8,451,559 B1 | 5/2013 | Berding et al. | |
| 8,533,934 B2 | 9/2013 | McGuire, Jr. et al. | |
| 8,564,900 B2 | 10/2013 | Hirono et al. | |
| 8,638,524 B2 * | 1/2014 | Brown | G11B 25/043 360/97.15 |
| 8,659,849 B2 * | 2/2014 | Hayakawa | G11B 33/148 360/97.22 |
| 8,699,179 B1 | 4/2014 | Golgolab et al. | |
| 8,854,766 B1 * | 10/2014 | Gustafson | G11B 33/1486 360/97.12 |
| 8,885,290 B1 * | 11/2014 | Gustafson | G11B 33/1466 360/97.16 |
| 9,001,458 B1 * | 4/2015 | Vitikkate | G11B 25/043 360/97.22 |
| 9,025,279 B2 * | 5/2015 | Furuta | G11B 33/1446 360/99.21 |
| 9,099,163 B1 * | 8/2015 | Casey | G11B 33/08 |
| 9,293,169 B2 * | 3/2016 | Andrikowich | G11B 33/1486 |
| 2008/0088969 A1 * | 4/2008 | Uefune | G11B 33/1466 360/99.21 |
| 2008/0165448 A1 * | 7/2008 | Ichikawa | G11B 25/043 360/97.22 |
| 2008/0310048 A1 * | 12/2008 | Hirono | G11B 33/1466 360/97.16 |
| 2011/0038076 A1 | 2/2011 | Hayakawa et al. | |
| 2011/0212281 A1 * | 9/2011 | Jacoby | G11B 25/043 428/35.8 |
| 2012/0176701 A1 | 7/2012 | Schreck | |
| 2012/0275286 A1 * | 11/2012 | McGuire, Jr. | G11B 25/043 369/75.11 |
| 2012/0275287 A1 | 11/2012 | McGuire, Jr. et al. | |
| 2014/0240869 A1 * | 8/2014 | Furuta | G11B 33/1446 360/110 |
| 2016/0104515 A1 * | 4/2016 | Strange | G11B 25/043 360/99.18 |

\* cited by examiner

US 9,570,114 B1

LAMINATED FILM-PACKED HARD DISK DRIVE FOR HERMETIC SEALING

FIELD OF EMBODIMENTS

Embodiments of the invention may relate generally to hard disk drives and more particularly to use of a film laminate for hermetically sealing a hard disk drive.

BACKGROUND

A hard-disk drive (HDD) is a non-volatile storage device that is housed in a protective enclosure and stores digitally encoded data on one or more circular disk having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head uses a magnetic field to read data from and write data to the surface of a magnetic-recording disk. A write head makes use of the electricity flowing through a coil, which produces a magnetic field. Electrical pulses are sent to the write head, with different patterns of positive and negative currents. The current in the coil of the write head induces a magnetic field across the gap between the head and the magnetic disk, which in turn magnetizes a small area on the recording medium.

HDDs are being manufactured which are hermetically sealed with helium inside. Further, other gases that are lighter than air have been contemplated for use as a replacement for air in sealed HDDs. There are various benefits to sealing and operating an HDD in helium ambient, for example, because the density of helium is one-seventh that of air. Hence, operating an HDD in helium reduces the drag force acting on the spinning disk stack and the mechanical power used by the disk spindle motor. Further, operating in helium reduces the flutter of the disks and the suspension, allowing for disks to be placed closer together and increasing the areal density (a measure of the quantity of information bits that can be stored on a given area of disk surface) by enabling a smaller, narrower data track pitch. The lower shear forces and more efficient thermal conduction of helium also mean the HDD will run cooler and will emit less acoustic noise. The reliability of the HDD is also increased due to low humidity, less sensitivity to altitude and external pressure variations, and the absence of corrosive gases or contaminants.

Electronic systems that require a hermetically-sealed internal volume (e.g., a lighter-than-air gas filled, sealed HDD) need a way of preventing the occurrence of leak paths through thin-walled parts of the HDD enclosure, such as the cover and the corresponding enclosure base to which the cover is coupled. One approach is to utilize two covers, one being the typical HDD cover coupled to the base with fasteners (a "first cover") but not hermetically-sealed, with another cover (a "second cover") being welded to the base over the first cover, such as by laser welding. However, sealing approaches involving laser welding secondary covers to the base are a relatively costly process in the context of mass production of HDDs.

Additionally, hermetically-sealed electronic systems need a way of connecting electrical lines through the enclosure. This may be accomplished with a hermetic electrical connector, or electrical "feed-through". One approach to hermetically sealing such an electrical feed-through is to apply solder around the perimeter of the feed-through near where the feed-through interfaces with the HDD enclosure base. However, such a soldering process may be a relatively costly process in the context of mass production of HDDs. Another approach to connecting electrical lines through a hermetically-sealed HDD enclosure may involve routing an electrical flexible cable assembly (or "flex cable") directly through an opening in the enclosure. However, this approach may pose challenges with achieving a robust hermetic seal.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY OF EMBODIMENTS

Embodiments of the invention are generally directed at a hard disk drive (HDD) in which a laminated film enclosure is used to hermetically seal an HDD within. The laminated film seal may comprise (a) a heat sealant layer hermetically-sealed around the HDD, (b) a barrier layer which inhibits gas from escaping (or egressing) from inside the laminated film enclosure to outside the laminated film enclosure, and (c) a film surface protective layer which protects the heat sealant and barrier layers.

Embodiments may include a heat sealant layer comprising a thermoplastic polymer, such as polypropylene for a non-limiting example; a barrier layer comprising a metal, such as aluminum for a non-limiting example; and a film surface protective layer comprising a thermoplastic polymer, such as polyethylene terephthalate for a non-limiting example.

Embodiments discussed in the Summary of Embodiments section are not meant to suggest, describe, or teach all the embodiments discussed herein. Thus, embodiments of the invention may contain additional or different features than those discussed in this section. Furthermore, no limitation, element, property, feature, advantage, attribute, or the like expressed in this section, which is not expressly recited in a claim, limits the scope of any claim in any way.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Approaches to a laminated film enclosure for a hermetically-sealed hard disk drive are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Illustrative Operating Context

Embodiments may be used in the context of a hermetic seal for a hard disk drive (HDD) storage device. Thus, in accordance with an embodiment, a plan view illustrating an HDD 100 is shown in FIG. 1 to illustrate an exemplary operating context.

Figure 1:
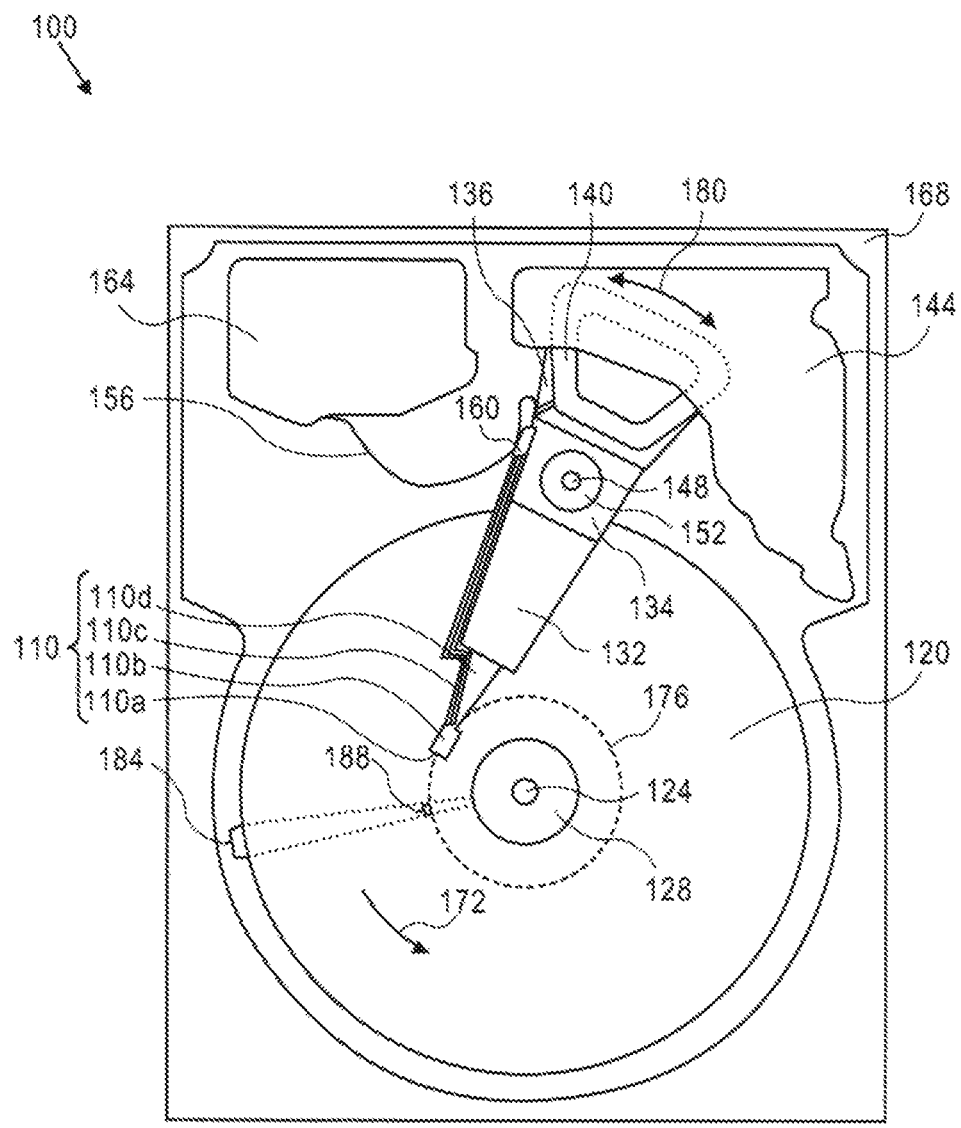
FIG. 1 is a plan view illustrating a hard disk drive (HDD), according to an embodiment.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable"). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Introduction

The term "hermetic" will be understood to describe a sealing arrangement designed to have nominally no (or negligible) gaseous leakage or permeation paths. While terms such as "hermetic", "negligible leakage", "no leakage", etc. may be used herein, note that such a system would often still have a certain amount of permeability and, therefore, not be absolutely leak-free.

Recall that electronic systems that require a hermetically sealed internal volume (e.g., a lighter-than-air gas-filled, sealed HDD) need a way of preventing the occurrence of leak paths through thin-walled parts, with one approach being to utilize two covers, the second of which may be laser welded to the base over the first cover. However, sealing approaches involving laser welding of a secondary cover to the base are a relatively costly process in the context of mass production of HDDs.

Recall also that hermetically-sealed electronic systems need a way of connecting electrical lines through the enclosure, which may be accomplished with a hermetic electrical connector (or electrical "feed-through") soldered to the HDD enclosure base.

Figure 2:
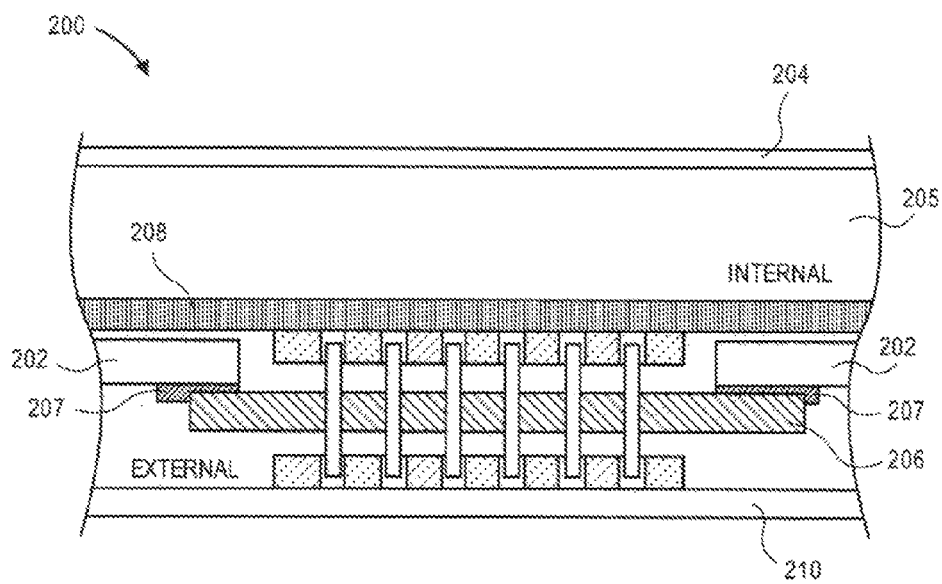
FIG. 2 is a cross-sectional side view illustrating an HDD electrical feed-through interface.

FIG. 2 is a cross-sectional side view illustrating an HDD electrical feed-through interface. Hermetically-sealed HDD 200 comprises an enclosure base 202 coupled with an HDD cover 204, thereby enclosing a sealed internal space 205. In order to electrically connect a flexible cable assembly 208 that is located inside the internal space 205 with a printed circuit board (PCB) 210 that is coupled to the base 202 outside of the internal space 205, a hermetic electrical connector 206 (or "feed-through" or "feed-through connector") is used at the interface between the internal space 205 and the external environment, i.e., at an orifice of the base 202. The connector 206 is attached to the base 202 using solder 207. In the configuration depicted in FIG. 2, the connector 206 is shown soldered to the underside of the base 202. While effective hermetically, the foregoing sealing arrangement may not be the most cost-effective approach.

Another approach to connecting electrical lines through a hermetically-sealed HDD enclosure may involve routing a flex cable directly through an opening in the enclosure, which is sealed with epoxy. However, this approach may pose challenges with achieving a robust hermetic seal.

Laminated Film Seal for Hermetically-Sealed Hard Disk Drive

An approach to sealing a hard disk drive, according to an embodiment, involves the use of a laminated film seal structure.

Figure 3:
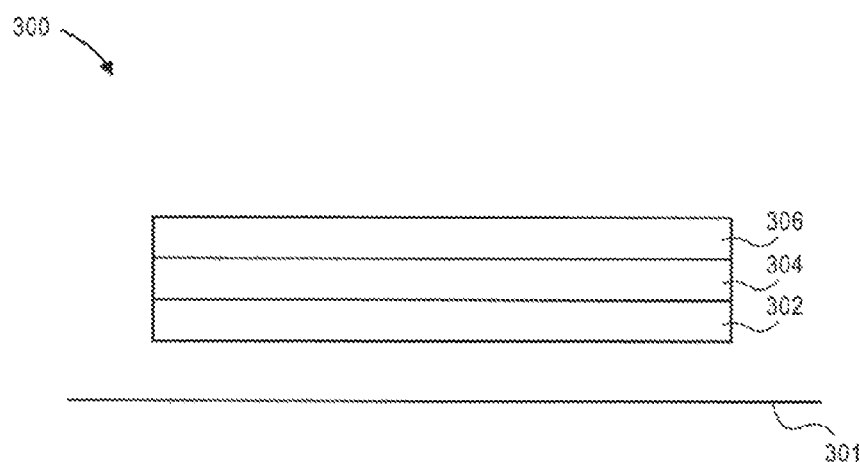
FIG. 3 is a cross-sectional side view illustrating a laminated film seal, according to an embodiment.

FIG. 3 is a cross-sectional side view illustrating a laminated film seal, according to an embodiment. A laminated film seal (or "seal laminate") relies on a laminated film structure to provide a hermetic seal. According to an embodiment, a laminated film seal is created based on a heat-sealing film or laminate bonded to at least one surface 301.

Laminated film 300 comprises a heat sealant layer 302 capable of forming a bond with another surface through the use of a heat-sealing process, e.g., based on corresponding ranges of temperature and pressure. Heat sealant layer 302 is covered by a barrier layer, which is designed to inhibit the escape (or "egress" or "diffusion") of gas through the laminated film 300, i.e., designed to be hermetically-permeable (or "impermeable"). Barrier layer 304 is covered by a film surface protective layer 306, which is designed to protect the heat sealant layer 302 and the barrier layer 304. Other additional layers may also be present in a laminated film such as laminated film 300, the material and structure of which may vary from implementation to implementation. For example, a metal adhesive layer with a polymeric base material may be implemented instead of or in addition to the heat sealant layer 302, or the heat sealant layer 302 may be constituent to a metal adhesive layer. In the case of a hermetically-sealed HDD, the laminated film 300 should be designed and configured to inhibit the egress of helium (He), nitrogen (N), or whatever lighter-than-air gas may be used within the sealed HDD.

According to an embodiment, the heat sealant layer 302 comprises a thermoplastic polymer or resin, such as polypropylene (also known as polypropene) [chemical formula=$(C_3H_6)_n$], polyethylene (also known as polyethene) [chemical formula=$(C_2H_4)_n$], and like polymers. According to a related embodiment, the heat sealant layer 302 comprises polypropylene.

According to an embodiment, the barrier layer 304 comprises a metal, such as aluminum, stainless steel, copper, and the like, having a relatively low permeability in relation to the target lighter-than-air gas being used to fill an HDD. According to a related embodiment, the barrier layer 304 comprises aluminum.

According to an embodiment, the barrier layer 304 comprises a copolymer or resin, such as ethylene vinyl alcohol (EVOH) [chemical formula=$(C_2H_4O—C_2H_4)_x$].

According to an embodiment, the film surface protective layer 306 comprises a thermoplastic polymer or resin, such as polyethylene terephthalate (PET) [chemical formula=$(C_{10}H_8O_4)_n$], polypropylene, and like polymers. According to a related embodiment, the film surface protective layer 306 comprises PET.

Film-Packed Hard Disk Drive

Figure 4:
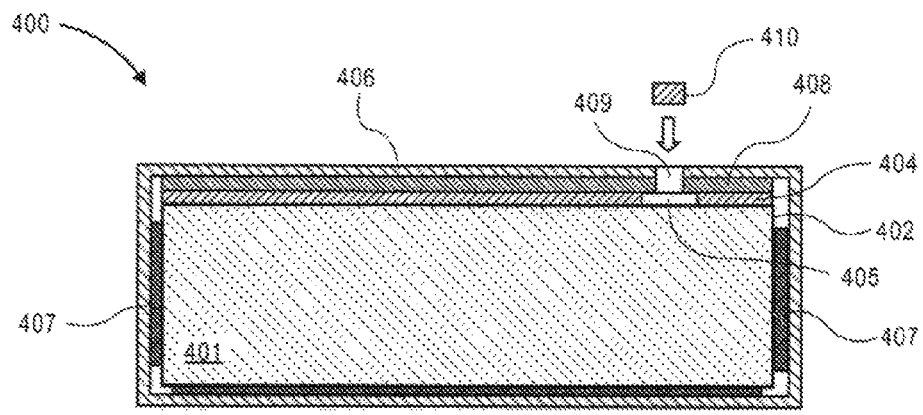
FIG. 4 is a cross-sectional side view illustrating a film-packed HDD, according to an embodiment.

FIG. 4 is a cross-sectional side view illustrating a film-packed HDD, according to an embodiment. Film-packed HDD assembly 400 includes an HDD 401 (internal components not shown, for clarity), such as HDD 100 (FIG. 1), comprising an enclosure base 402 to which a cover 404 is attached. HDD 401 may be characterized as a conventional HDD, for which an HDD cover such as cover 404 is typically attached to an HDD base such as base 402 using a plurality of fasteners. Thus, HDD 401 may be characterized as "an unsealed HDD" or "an unsealed HDD assembly".

According to an embodiment, film-packed HDD assembly 400 comprises a laminated film enclosure 406 that envelops the unsealed HDD 401, where the laminated film from which the laminated film enclosure 406 is constructed, is constructed as illustrated and described in reference to laminated film 300 (FIG. 3). As such, laminated film enclosure 406 comprises (a) a heat sealant layer (e.g., heat sealant layer 302 of FIG. 3) hermetically-sealed around the unsealed HDD 401; (b) a barrier layer (e.g., barrier layer 304 of FIG. 3) that inhibits escape, egress, diffusion of gas from the inside of the laminated film enclosure 406 to the outside of the laminated film enclosure 406; and (c) a film surface protective layer (e.g., film surface protective layer 306 of FIG. 3) that protects the heat sealant and barrier layers.

With an HDD wrapped with a hermetically-sealed laminated film enclosure, such as film-packed HDD assembly 400, issues may arise regarding the atmospheric pressure difference between the inside and the outside of the film-packed HDD, whereby the laminated film enclosure may expand undesirably. According to an embodiment, film-packed HDD assembly 400 further comprises an adhesive 407, which bonds the laminated film enclosure 406 to at least a portion of the base 402. By bonding the laminated film enclosure 406 to an outside surface of the HDD 401, the laminated film enclosure 406 may be prevented from expanding in response to an atmospheric pressure difference between the inside and the outside of the film-packed HDD assembly 400. According to a related embodiment, and as depicted in FIG. 4, film-packed HDD assembly 400 comprises an adhesive 407, which bonds the laminated film enclosure 406 to at least one side of the base 402. However, the placement of adhesive 407 may vary from implementation to implementation. For a non-limiting example, adhesive 407 may be bonded to at least a portion of the bottom surface of the base 402.

With a sealed HDD, in which a lighter-than-air gas is contained therein, the cover 404 comprises a gas injection port 405 (or "hole") for purposes of injecting the gas into the HDD 401 enclosure. According to an embodiment, the laminated film enclosure 406 comprises a gas injection hole 409, through which gas can be injected into the HDD 401 via the positionally-corresponding gas injection port 405 of the HDD 401. Once the HDD 401 is filled with gas, at least the hole 409 may be filled or plugged with a pin 410 in order to contain the gas within the HDD 401 enclosure.

Because the laminated film enclosure 406 is not likely a rigid structure, according to an embodiment a rigid plate 408, similarly comprising a plate gas injection hole, is bonded to the laminated film enclosure 406 around the hole 409 in the laminated film enclosure 406. For non-limiting examples, plate 408 may be constructed of a metal, such as aluminum or stainless steel, and bonded to the laminated film enclosure 406 with an adhesive. Plate 408 thereby provides some rigidity for disposing and holding of the pin 410 in the hole 409, e.g., after the laminated film enclosure 406 is heat-sealed closed, vacuumed, and the gas injected. FIG. 4 depicts the plate 408 bonded to an interior surface of the laminated film enclosure 406, according to an embodiment. However, the placement of the plate 408 may vary from implementation to implementation. For a non-limiting example, alternatively the plate 408 may be bonded to an exterior surface of the laminated film enclosure 406.

Because there is a possibility that the gas injection hole 409 of the laminated film enclosure 406 may not precisely line up with the gas injection port 405 of the cover 404, according to an embodiment the gas injection port 405 of the cover 404 is made to be larger than the gas injection hole 409 of the laminated film enclosure 406, thereby providing more positional tolerance between the corresponding gas injection hole 409 and port 405.

Film-Packed Hard Disk Drive with Flexible Cable Assembly

Figure 5A:
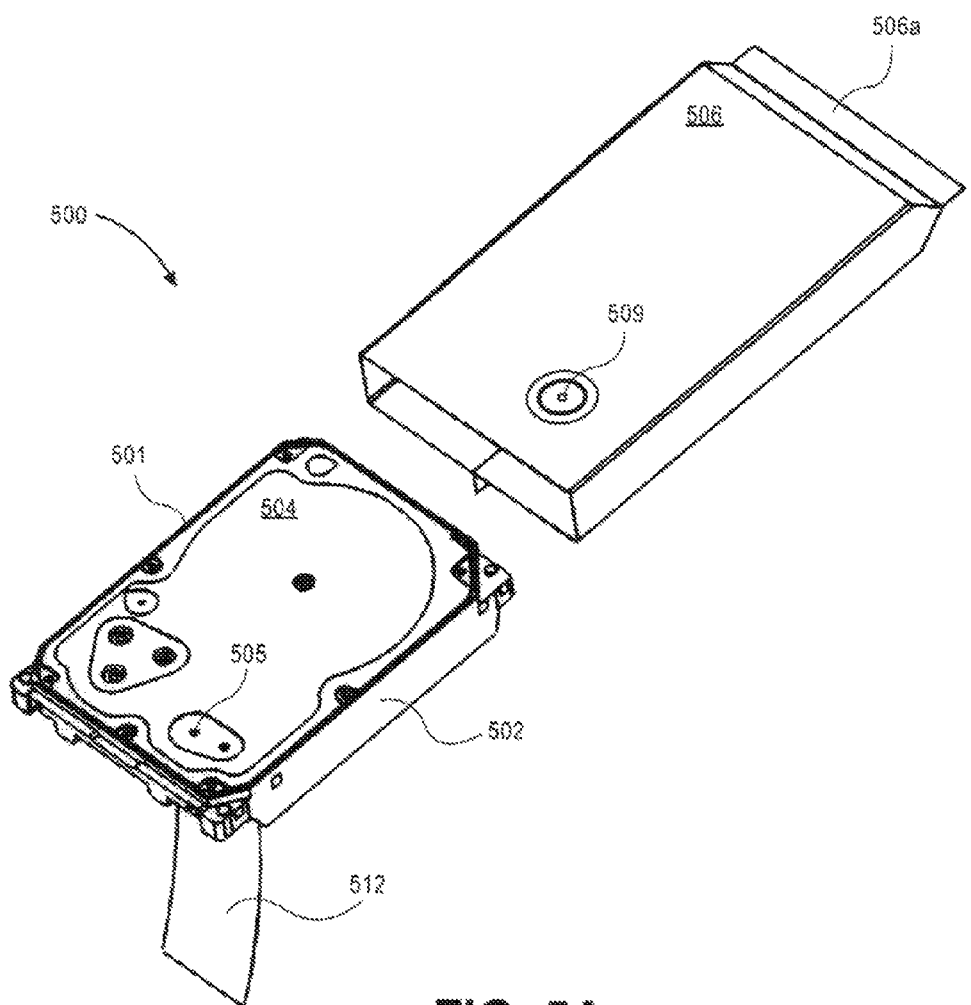
FIG. 5A is an exploded perspective view illustrating a film-packed HDD having an electrical flexible cable assembly (FCA), according to an embodiment.
Figure 5B:
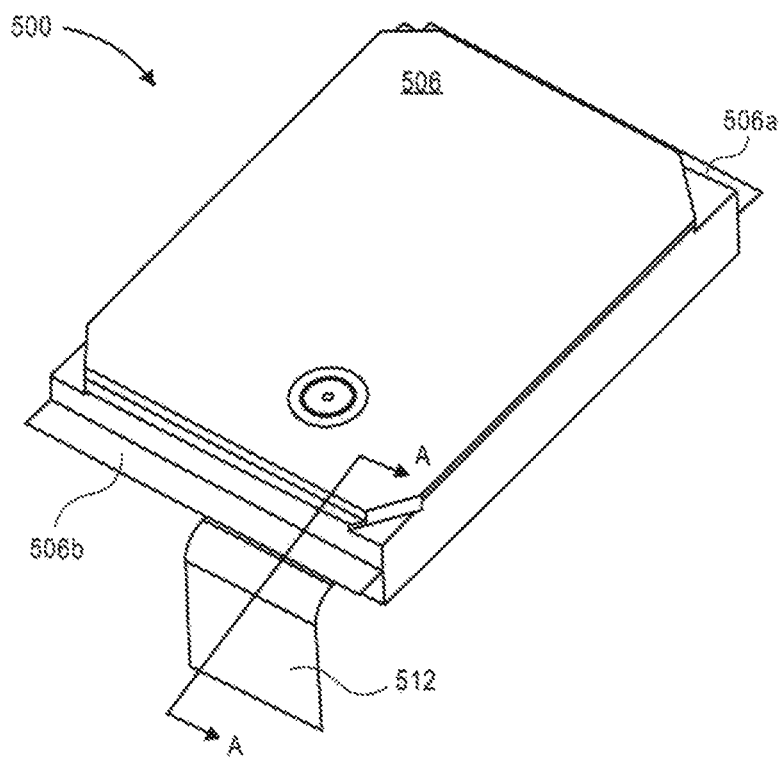
FIG. 5B is a perspective view illustrating the film-packed HDD of FIG. 5A, according to an embodiment.

FIG. 5A is an exploded perspective view illustrating a film-packed HDD having an electrical flexible cable assembly (FCA), and FIG. 5B is a perspective view illustrating the film-packed HDD of FIG. 5A, both according to an embodiment. Film-packed HDD 500 includes an HDD 501, such as HDD 100 (FIG. 1), comprising an enclosure base 502 to which a cover 504 is attached. HDD 501 may be characterized as a conventional HDD, for which an HDD cover such as cover 504 is typically attached to an HDD base such as base 502 using a plurality of fasteners. Thus, HDD 501 may be characterized as "an unsealed HDD" or "an unsealed HDD assembly". HDD 501 further comprises a gas injection port 505, same as or similar to the gas injection port 405 (FIG. 4), for purposes of injecting the gas into the HDD 501 enclosure.

According to an embodiment, similarly to film-packed HDD 400, film-packed HDD assembly 500 comprises a laminated film enclosure 506, having a first heat-sealed area 506a (FIG. 5A) and a second heat-sealed area 506b (FIG. 5B), used to envelop the unsealed HDD 501. The laminated film, from which the laminated film enclosure 506 is constructed, is constructed as illustrated and described in reference to laminated film 300 (FIG. 3). Note that the shape of a film-packed HDD such as HDD assembly 500 is such that it can still satisfy the outer dimensions of relevant form factor specification(s). According to an embodiment, the laminated film enclosure 506 comprises a gas injection hole 509, same as or similar to the gas injection hole 409 (FIG. 4), through which gas can be injected into the HDD 501 via the positionally-corresponding gas injection port 505 of the HDD 501.

According to an embodiment, an electrical flexible cable assembly (FCA) 512 is used to electrically connect electrical lines from the inside of HDD 501 through an opening in the enclosure base 502 to the outside of the HDD 501. Hence, with such a configuration of a sealed film-packed HDD such as HDD 500, the FCA 512 needs to be routed through, bonded with, and hermetically sealed with the laminated film enclosure 506, e.g., by way of applying heat and pressure to the heat sealant layer of the laminated film at the second heat-sealed area 506b.

Figure 5C:
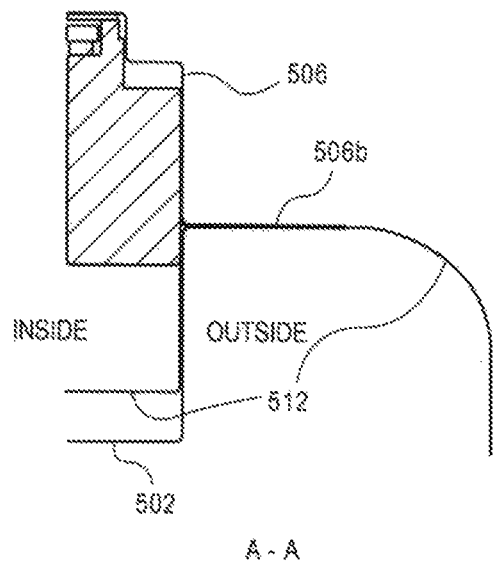
FIG. 5C is a cross-sectional side view focusing on the FCA interface, according to an embodiment.

FIG. 5C is a cross-sectional side view focusing on the FCA interface, according to an embodiment. Cross-sectional view A-A illustrates the routing of the FCA 512 from inside the enclosure base 502 to the outside of the base 502, and thus to the outside of the HDD 501, and depicts an example of how the laminated film enclosure 506 is bonded with, and hermetically sealed around, the FCA 512 at the second heat-sealed area 506b.

A Method of Sealing a Hard Disk Drive with a Laminated Film Enclosure

Figure 6:
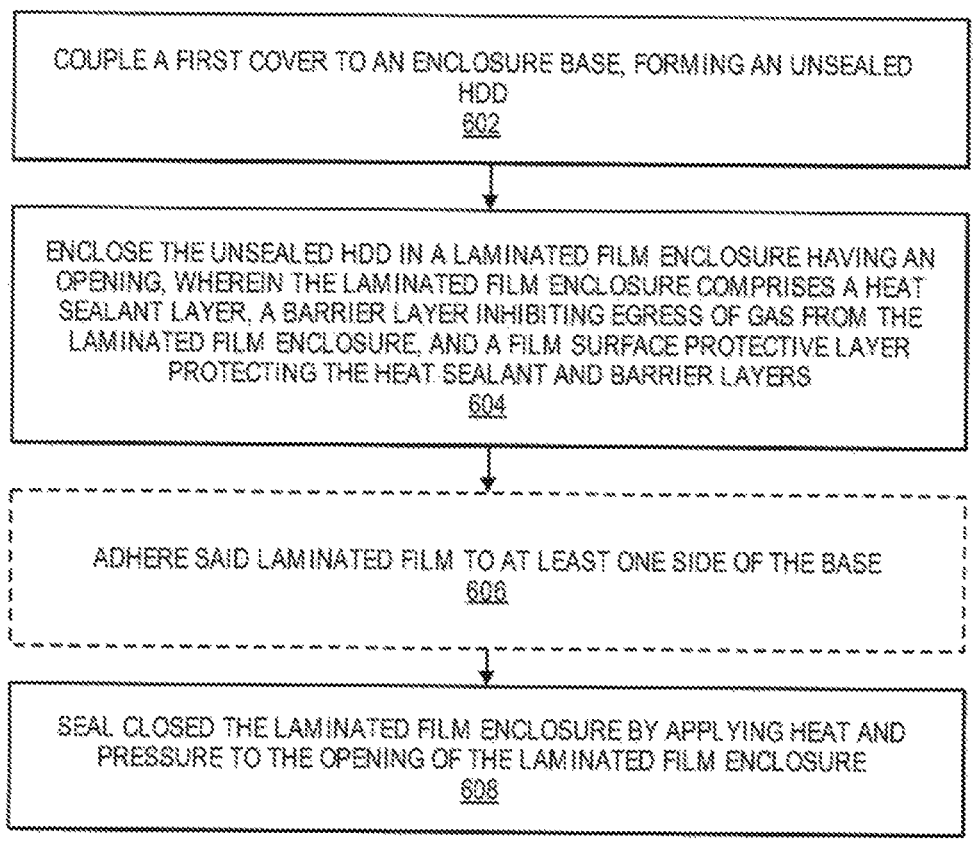
FIG. 6 is a flow diagram illustrating a method of sealing an HDD, according to an embodiment.

FIG. 6 is a flow diagram illustrating a method of sealing an HDD, according to an embodiment.

At block 602, a first cover is coupled to an enclosure base, forming an "unsealed HDD". For example, cover 504 (FIG. 5A) is coupled to base 502 using a plurality of fasteners at various locations around the perimeter.

At block 604, the unsealed HDD is enclosed in a laminated film enclosure that has an opening, where the laminated film enclosure comprises a heat sealant layer, a barrier layer that inhibits the escape, egress, diffusion of gas from the inside of the laminated film enclosure, and a film surface protective layer that protects the heat sealant and barrier layers. For example, HDD 501 (FIG. 5A) is enclosed within, or enveloped by, the laminated film enclosure 506 (FIG. 5A) constructed as illustrated and described in reference to laminated film 300 (FIG. 3).

At optional block 606, according to an embodiment, the laminated film is adhered to at least one side of the base. For example, laminated film enclosure 406 (FIG. 4) is adhered to sides of the enclosure base 402 (FIG. 4) using an adhesive 407 (FIG. 4). As described, by bonding the laminated film enclosure 406 to an outside surface of the HDD 401 (FIG. 4), the laminated film enclosure 406 may be prevented from expanding in response to an atmospheric pressure difference between the inside and the outside of the film-packed HDD assembly 400 (FIG. 4).

At block 608, the laminated film enclosure is sealed closed by applying suitable heat and pressure to the opening of the laminated film enclosure. For example, laminated film enclosure 506 (FIG. 5B) is sealed closed by vacuuming out the air and then applying suitable heat and pressure to heat-seal the second heat-sealed area 506b (FIG. 5B).

As illustrated and described in reference to FIGS. 5A-5C and according to an embodiment, prior to sealing at block 608, an electrical flexible cable assembly (FCA) may be routed through an opening in the base and an opening (which becomes the heat-sealed area 506b, for example) of the laminated film enclosure, and the sealing at block 608 includes bonding the heat sealant layer of the laminated film to, and hermetically sealing around, the FCA. For example, FCA 512 (FIG. 5C) is routed through an opening in the base 502 (FIG. 5C) and an opening in the laminated film enclosure 506 (FIG. 5A) and bonded and hermetically sealed with the laminated film enclosure 506 at the heat-sealed area 506b (FIG. 5B, 5C).

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A hard disk drive (HDD) assembly comprising:
   an enclosure base;
   a cover coupled to said base, forming an unsealed HDD assembly; and
   a laminated film enclosure in which said entire unsealed HDD assembly is enveloped, said laminated film comprising:
      a heat sealant layer hermetically-sealed around said unsealed HDD assembly,
      a barrier layer inhibiting escape of gas from inside of said laminated film enclosure to outside of said laminated film enclosure, and
      a film surface protective layer protecting said heat sealant and barrier layers.

2. The hard disk drive assembly of claim 1, further comprising:
   an adhesive bonding said laminated film enclosure to at least a portion of said base.

3. The hard disk drive assembly of claim 1, further comprising:
   an adhesive bonding said laminated film enclosure to at least one side of said base.

4. The hard disk drive assembly of claim 1, wherein said laminated film enclosure further comprises a film gas injection hole, and further comprising:
   a rigid plate bonded to said laminated film enclosure around said gas injection hole.

5. The hard disk drive assembly of claim 4, wherein said rigid plate comprises a plate gas injection hole and is bonded to an inside surface of said laminated film enclosure, and further comprising:
   a pin disposed within said plate gas injection hole.

6. The hard disk drive assembly of claim 1,
   wherein said cover comprises a cover gas injection hole;
   wherein said laminated film enclosure further comprises a film gas injection hole positioned corresponding with said cover gas injection hole; and
   wherein said cover gas injection hole is larger than said film gas injection hole.

7. The hard disk drive assembly of claim 1, further comprising:
   an electrical flexible cable assembly routed through an opening in said base and through said laminated film enclosure; and
   wherein said heat sealant layer of said laminated film is bonded to, and hermetically sealed around, said flexible cable assembly.

8. The hard disk drive assembly of claim 1, wherein said heat sealant layer comprises a thermoplastic polymer.

9. The hard disk drive assembly of claim 1, wherein said heat sealant layer comprises polypropylene.

10. The hard disk drive assembly of claim 1, wherein said barrier layer comprises a metal.

11. The hard disk drive assembly of claim 1, wherein said barrier layer comprises aluminum.

12. The hard disk drive assembly of claim 1, wherein said film surface protective layer comprises a thermoplastic polymer.

13. The hard disk drive assembly of claim 1, wherein said film surface protective layer comprises polyethylene terephthalate.

14. The hard disk drive assembly of claim 1,
wherein said heat sealant layer comprises polypropylene;
wherein said barrier layer comprises aluminum; and
wherein said film surface protective layer comprises polyethylene terephthalate.

15. A method of sealing a hard disk drive (HDD), the method comprising:
coupling a first cover to an enclosure base, forming an unsealed HDD;
enclosing said unsealed HDD in its entirety in a laminated film enclosure having an opening, wherein said laminated film enclosure comprises a heat sealant layer, a barrier layer inhibiting egress of gas from said laminated film enclosure, and a film surface protective layer protecting said heat sealant and barrier layers; and
sealing closed said laminated film enclosure by applying heat and pressure to said opening of said laminated film enclosure.

16. The method of claim 15, further comprising:
prior to said sealing, adhering said laminated film to at least one side of said base.

17. The method of claim 15, wherein said laminated film enclosure further comprises a film gas injection hole and a rigid plate bonded to an inside surface of said laminated film enclosure surrounding said film gas injection hole, wherein said rigid plate comprises a plate gas injection hole positioned to correspond with said film gas injection hole, said method further comprising:
after said sealing, injecting a lighter-than-air gas into said unsealed HDD through said film gas injection hole and said plate gas injection hole and an HDD cover gas injection port; and
inserting a pin into at least said film gas injection hole and said plate gas injection hole.

18. The method of claim 15, further comprising:
prior to said sealing, routing an electrical flexible cable assembly through an opening in said base and through said opening of said laminated film enclosure; and
wherein said sealing includes bonding said heat sealant layer of said laminated film to, and hermetically sealing around, said flexible cable assembly.

19. The method of claim 15, wherein:
said heat sealant layer comprises polypropylene;
said barrier layer comprises aluminum; and
said film surface protective layer comprises polyethylene terephthalate.

20. A hard disk drive (HDD) assembly comprising:
an enclosure base;
a cover coupled to said base, forming an unsealed HDD assembly;
a laminated film enclosure enveloping said unsealed HDD assembly, said laminated film comprising:
a heat sealant layer hermetically-sealed around said unsealed HDD assembly,
a barrier layer inhibiting escape of gas from inside of said laminated film enclosure to outside of said laminated film enclosure,
a film surface protective layer protecting said heat sealant and barrier layers, and
a film gas injection hole; and
a rigid plate bonded to said laminated film enclosure around said film gas injection hole.

21. The hard disk drive assembly of claim 20, wherein said rigid plate comprises a plate gas injection hole and is bonded to an inside surface of said laminated film enclosure, said hard disk drive assembly further comprising:
a pin disposed within said plate gas injection hole.

22. The hard disk drive assembly of claim 20, further comprising:
an electrical flexible cable assembly routed through an opening in said base and through said laminated film enclosure;
wherein said heat sealant layer of said laminated film is bonded to, and hermetically sealed around, said flexible cable assembly.

* * * * *